United States Patent
Yang et al.

(10) Patent No.: US 12,354,680 B2
(45) Date of Patent: Jul. 8, 2025

(54) HIGH PERFORMANCE VERIFY TECHNIQUES IN A MEMORY DEVICE

(71) Applicant: SanDisk Technologies LLC, Addison, TX (US)

(72) Inventors: Xiang Yang, Santa Clara, CA (US); Wei Cao, Fremont, CA (US); Deepanshu Dutta, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 253 days.

(21) Appl. No.: 17/957,606

(22) Filed: Sep. 30, 2022

(65) Prior Publication Data

US 2024/0112744 A1 Apr. 4, 2024

(51) Int. Cl.
*G11C 11/34* (2006.01)
*G11C 16/08* (2006.01)
*G11C 16/10* (2006.01)
*G11C 16/34* (2006.01)

(52) U.S. Cl.
CPC .......... *G11C 16/3459* (2013.01); *G11C 16/08* (2013.01); *G11C 16/102* (2013.01)

(58) Field of Classification Search
CPC .... G11C 16/3459; G11C 16/06; G11C 16/102
USPC ..................................................... 365/185.22
See application file for complete search history.

(56) References Cited

U.S. PATENT DOCUMENTS

| | | | | |
|---|---|---|---|---|
| 7,243,275 B2* | 7/2007 | Gongwer | ........... | G11C 16/3459 365/201 |
| 7,307,887 B2* | 12/2007 | Chen | ................... | G11C 11/5628 369/30.21 |
| 7,768,836 B2* | 8/2010 | Li | ....................... | G11C 11/5628 365/185.24 |
| 8,379,454 B2* | 2/2013 | Kochar | .................. | G11C 29/52 365/189.011 |
| 8,730,722 B2* | 5/2014 | Koh | ..................... | G11C 11/5628 365/189.05 |
| 9,142,302 B2* | 9/2015 | Dong | .................... | G11C 16/349 |
| 9,164,526 B2* | 10/2015 | Pan | ........................ | G11C 16/06 |
| 9,305,651 B1* | 4/2016 | Tam | .................... | G11C 16/3495 |

(Continued)

FOREIGN PATENT DOCUMENTS

| | | |
|---|---|---|
| JP | 2014078308 A | 5/2014 |
| JP | 2018032457 A | 3/2018 |

(Continued)

*Primary Examiner* — Viet Q Nguyen
(74) *Attorney, Agent, or Firm* — Dickinson Wright PLLC

(57) ABSTRACT

The memory device includes at least one memory block with a plurality of memory cells arranged in a plurality of word lines. The memory device includes control circuitry that is configured to program the memory cells of the at least one memory block in a plurality of program loops. The control circuitry is further configured to receive a command to write user data to the memory device. On at least a portion of a selected word line of the plurality of word lines, the control circuitry is configured to perform a smart verify operation to acquire a smart verify programming voltage. After the smart verify programming voltage is acquired, in a plurality of program loops, the control circuitry is configured to program the memory cells of the selected word line to include the user data and data that corresponds to the smart verify programming voltage.

20 Claims, 19 Drawing Sheets

(56) References Cited

U.S. PATENT DOCUMENTS

| | | | |
|---|---|---|---|
| 9,564,226 B1* | 2/2017 | Dunga | G11C 16/3459 |
| 10,008,276 B2* | 6/2018 | Huynh | G11C 29/028 |
| 11,410,729 B2* | 8/2022 | Nishikawa | G11C 16/0483 |
| 11,538,538 B1* | 12/2022 | Tian | G11C 16/3481 |
| 11,854,620 B2* | 12/2023 | Penzo | G11C 11/5628 |
| 11,894,077 B2* | 2/2024 | Zhang | G11C 16/3459 |
| 11,942,157 B2* | 3/2024 | Guo | G11C 16/24 |
| 2006/0104120 A1 | 5/2006 | Hemink | |
| 2010/0091573 A1* | 4/2010 | Li | G11C 11/5628 |
| | | | 365/185.03 |
| 2010/0329022 A1 | 12/2010 | Baik et al. | |
| 2015/0380093 A1 | 12/2015 | Shim et al. | |
| 2019/0180831 A1 | 6/2019 | Shukla et al. | |
| 2020/0013470 A1* | 1/2020 | Nishikawa | G11C 29/52 |
| 2020/0026346 A1* | 1/2020 | Nosaka | G06F 9/5027 |
| 2022/0293197 A1 | 9/2022 | Prakash et al. | |
| 2022/0406380 A1* | 12/2022 | Penzo | G11C 16/349 |
| 2024/0071525 A1* | 2/2024 | Zhang | G11C 16/3459 |

FOREIGN PATENT DOCUMENTS

| | | |
|---|---|---|
| TW | I536386 B | 6/2016 |
| TW | I707362 B | 10/2020 |

\* cited by examiner

| | | | | | | | | |
|---|---|---|---|---|---|---|---|---|
| 10.0V | 0 | 0 | 0 | 0 | 0 | 0 | 0 | 0 |
| 10.1V | 0 | 0 | 0 | 0 | 0 | 0 | 0 | 1 |
| 10.2V | 0 | 0 | 0 | 0 | 0 | 0 | 1 | 0 |
| 10.3V | 0 | 0 | 0 | 0 | 0 | 0 | 1 | 1 |
| 10.4V | 0 | 0 | 0 | 0 | 0 | 1 | 0 | 0 |
| 10.5V | 0 | 0 | 0 | 0 | 0 | 1 | 0 | 1 |
| 10.6V | 0 | 0 | 0 | 0 | 0 | 1 | 1 | 0 |
| 10.7V | 0 | 0 | 0 | 0 | 0 | 1 | 1 | 1 |

• • • • • •

| | | | | | | | | |
|---|---|---|---|---|---|---|---|---|
| 22.7V | 0 | 1 | 1 | 1 | 1 | 1 | 1 | 1 |

*FIG. 14*

| WORD LINE | STRING_0 | STRING_1 | STRING_2 | STRING_3 |
|---|---|---|---|---|
| WLn | 1<br>ACQUIRE SV_VPGM_WLn.<br>PROGRAM USER DATA AND<br>SV_VPGM_WLn | 2<br>PROGRAM STARTING WITH<br>SV_VPGM_WLn | 3<br>PROGRAM STARTING WITH<br>SV_VPGM_WLn | 4<br>PROGRAM STARTING WITH<br>SV_VPGM_WLn |
| WLn+1 | 5<br>ACQUIRE SV_VPGM_WLn+1.<br>PROGRAM USER DATA AND<br>SV_VPGM_WLn+1 | 6<br>PROGRAM STARTING WITH<br>SV_VPGM_WLn+1 | 7<br>PROGRAM STARTING WITH<br>SV_VPGM_WLn+1 | 8<br>PROGRAM STARTING WITH<br>SV_VPGM_WLn+1 |
| WLn+2 | 9<br>ACQUIRE SV_VPGM_WLn+2.<br>PROGRAM USER DATA AND<br>SV_VPGM_WLn+2 | 10<br>PROGRAM STARTING WITH<br>SV_VPGM_WLn+2 | 11<br>PROGRAM STARTING WITH<br>SV_VPGM_WLn+2 | 12<br>PROGRAM STARTING WITH<br>SV_VPGM_WLn+2 |
| ... | ... | ... | ... | ... |

*FIG. 18*

HIGH PERFORMANCE VERIFY TECHNIQUES IN A MEMORY DEVICE

BACKGROUND

1. Field

The present disclosure is related generally to memory devices and more particularly to techniques for verifying the threshold voltages of memory cells during a programming operation.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

NAND memory devices include a chip with a plurality of memory blocks, each of which includes an array of memory cells arranged in a plurality of word lines. Programming the memory cells of a word line to retain data typically occurs in a plurality of program loops, each of which includes the application of a programming pulse to a control gate of the word line and, optionally, a verify operation to sense the threshold voltages of the memory cells being programmed. In many programming techniques, the programming pulse has an initial programming voltage in a first program loop, and then the voltage of the programming pulse increases incrementally between program loops until programming is completed. An optimal value for the initial programming voltage varies across the plurality of memory blocks in the chip and may also vary among the word lines of a single memory block. If the initial programming voltage is set too high, over programming of some memory cells can occur, but if it is set too low, programming performance may suffer.

One approach to improve programming performance without just setting the initial programming voltage at a high level such that over programming might occur is to conduct a smart verify operation when a programming operation in a memory block begins. The smart verify operation includes a plurality of smart verify programming loops, each of which includes a programming pulse and a verify operation. During the verify operation of each smart verify programming loop, a number of memory cells that have threshold voltages which are greater than a predetermined verify voltage is determined and compared to a target. If the verify operation passes, then the voltage of the last programming pulse is stored in a NAND register of the chip and used as the initial programming voltage for subsequent programming operations in the memory block. However, the NAND register is typically not capable of retaining all of the optimal initial programming voltages for all of the memory blocks in the chip.

SUMMARY

One aspect of the present disclosure is related to a method of programming a memory device. The method includes the step of receiving a command to write user data to the memory device. The method proceeds with the step of preparing at least one memory block that includes a plurality of memory cells arranged in a plurality of word lines. On at least a portion of a selected word line of the plurality of word lines, the method proceeds with the step of performing a smart verify operation to acquire a smart verify programming voltage. After the smart verify programming voltage is acquired, in a plurality of program loops, the method continues with the step of programming the memory cells of the selected word line to include the user data and data that corresponds to the smart verify programming voltage.

According to another aspect of the present disclosure, the selected word line includes a plurality of strings, and the step of performing the smart verify operation to acquire the smart verify programming voltage is only on a first string of the plurality of strings. The step of programming the memory cells of the selected word line includes programming the data that corresponds to the smart verify programming voltage into the memory cells of the first string of the selected word line.

According to yet another aspect of the present disclosure, the method further includes the step of programming the user data into the memory cells of the other strings of the selected word line in a plurality of program loops using the smart verify programming voltage as an initial programming voltage.

According to still another aspect of the present disclosure, each of the word lines of the memory block includes the plurality of strings. The method further includes the steps of performing the smart verify operation on the first string of each of the word lines to acquire the smart verify programming voltage for each word line and programming in data that corresponds to the smart verify programming voltage for each word line into the memory cells of the first string of that word line.

According to a further aspect of the present disclosure, the smart verify programming voltage programmed into the memory cells of the first string of the selected word line is the initial programming voltage when programming at least one additional word line in a plurality of program loops.

According to yet a further aspect of the present disclosure, the memory cells of the first string that are programmed to contain the data that corresponds to the smart verify programming voltage are programmed to a one bit per memory cell (SLC) storage scheme.

According to still a further aspect of the present disclosure, the memory cells of the first string that are programmed to contain the user data are programmed to a one or more bits per memory cell storage scheme.

According to another aspect of the present disclosure, the data that corresponds to the smart verify programming voltage and that is programmed to the memory cells of the first string is no more than one byte of data.

According to yet another aspect of the present disclosure, the memory device has a NAND register that can contain only one byte of data or no more than three bytes of data.

Another aspect of the present disclosure is related to a memory device. The memory device includes at least one memory block with a plurality of memory cells arranged in a plurality of word lines. The memory device includes control circuitry that is configured to program the memory cells of the at least one memory block in a plurality of program loops. The control circuitry is further configured to receive a command to write user data to the memory device. On at least a portion of a selected word line of the plurality of word lines, the control circuitry is configured to perform a smart verify operation to acquire a smart verify programming voltage. After the smart verify programming voltage is acquired, in a plurality of program loops, the control circuitry is configured to program the memory cells of the selected word line to include the user data and data that corresponds to the smart verify programming voltage.

According to another aspect of the present disclosure, the selected word line includes a plurality of strings, and the control circuitry is configured to program the data that corresponds to the smart verify programming voltage into the memory cells of the first string of the selected word line.

According to yet another aspect of the present disclosure, the control circuitry is further configured to program the user data into the memory cells of the other strings of the selected word line in a plurality of program loops using the smart verify programming voltage as an initial programming voltage.

According to still another aspect of the present disclosure, each of the word lines of the memory block includes the plurality of strings. The control circuitry is further configured to perform the smart verify operation on the first string of each of the word lines to acquire the smart verify programming voltage for each word line and program data that corresponds to the smart verify programming voltage for each word line into the memory cells of the first string of that word line.

According to a further aspect of the present disclosure, the smart verify programming voltage programmed into the memory cells of the first string of the selected word line by the control circuitry is the initial programming voltage when programming at least one additional word line of the memory block in a plurality of program loops.

According to yet a further aspect of the present disclosure, the memory cells of the first string that are programmed by the control circuitry to contain the data that corresponds to the smart verify programming voltage are programmed to a one bit per memory cell (SLC) storage scheme.

According to still a further aspect of the present disclosure, the memory cells of the first string that are programmed by the control circuitry to contain the user data are programmed to a two or more bits per memory cell storage scheme.

According to another aspect of the present disclosure, the data that corresponds to the smart verify programming voltage and that is programmed to the memory cells of the first string is no more than one byte of data.

According to yet another aspect of the present disclosure, the memory device further includes a NAND register that can contain only one byte of data or no more than three bytes of data.

Yet another aspect of the present disclosure is related to an apparatus that includes at least one memory block that includes a plurality of memory cells arranged in a plurality of word lines. The apparatus also includes a programming means for programming user data into the plurality of memory cells. The programming means is configured to program the memory cells of the at least one memory block in a plurality of program loops. The programming means is further configured to receive a command to write user data to the memory device. On a first string of a plurality of strings of a selected word line of the plurality of word lines, the programming means is configured to perform a smart verify operation to acquire a smart verify programming voltage. After the smart verify programming voltage is acquired, in a plurality of program loops, the programming means is further configured to program the memory cells of the selected word line to include the user data and data that corresponds to the smart verify programming voltage. The programming means is further configured to program the memory cells of the other strings of the selected word line in a plurality of program loops using the smart verify programming voltage as an initial programming voltage.

According to another aspect of the present disclosure, the programming means is further configured to perform the smart verify operation on the first string of each word line of the plurality of word lines in the memory block and program data corresponding to a unique smart verify programming voltage into the memory cells of the first string of each word line.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 14 depicts an example table of SV_VPGM voltages associated with different bit combinations in a smart verify byte;

FIG. 18 depicts a table of a sequence of programming the memory cells in an example embodiment while utilizing one embodiment of the programming techniques of the present disclosure.

DESCRIPTION OF THE ENABLING EMBODIMENTS

An aspect of the present disclosure is related to an improved technique for programming the memory cells of a memory block such that when a smart verify voltage is acquired during a smart verify operation in a memory block, it is saved directly into the memory cells of the memory block in addition to the NAND register. In the case that the memory device undergoes a block jump (a change from programming one memory block to another memory block) and the smart verify voltage saved in the NAND register does not match with the newly selected block, the smart verify voltage for the newly selected block does not have to be re-acquired but can instead be readily accessed from the memory cells of the memory block and input into the NAND register. These programming techniques improve performance by allowing the memory device to skip the time-consuming smart verify operation in certain instances, such as following a block jump, without risking over programming. These programming techniques are discussed in further detail below.

Figure 1A:
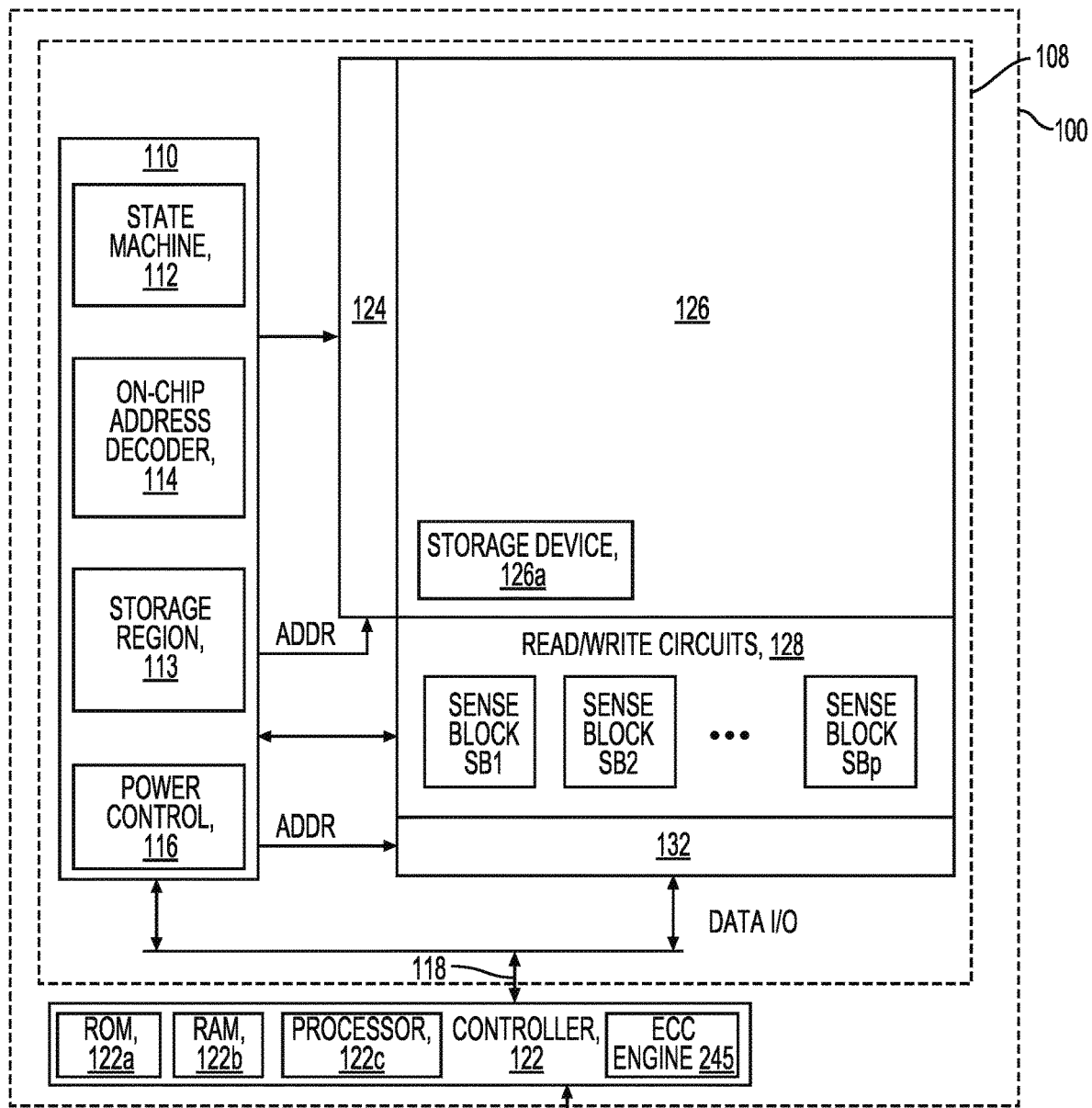
FIG. 1A is a block diagram of an example memory device.

FIG. 1A is a block diagram of an example memory device 100 is configured to operate according to the programming techniques of the present disclosure. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, if a programming operation is completed.

Figure 1B:
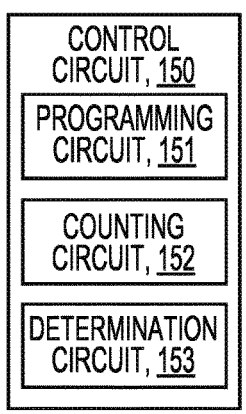
FIG. 1B is a block diagram of an example control circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245.

The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
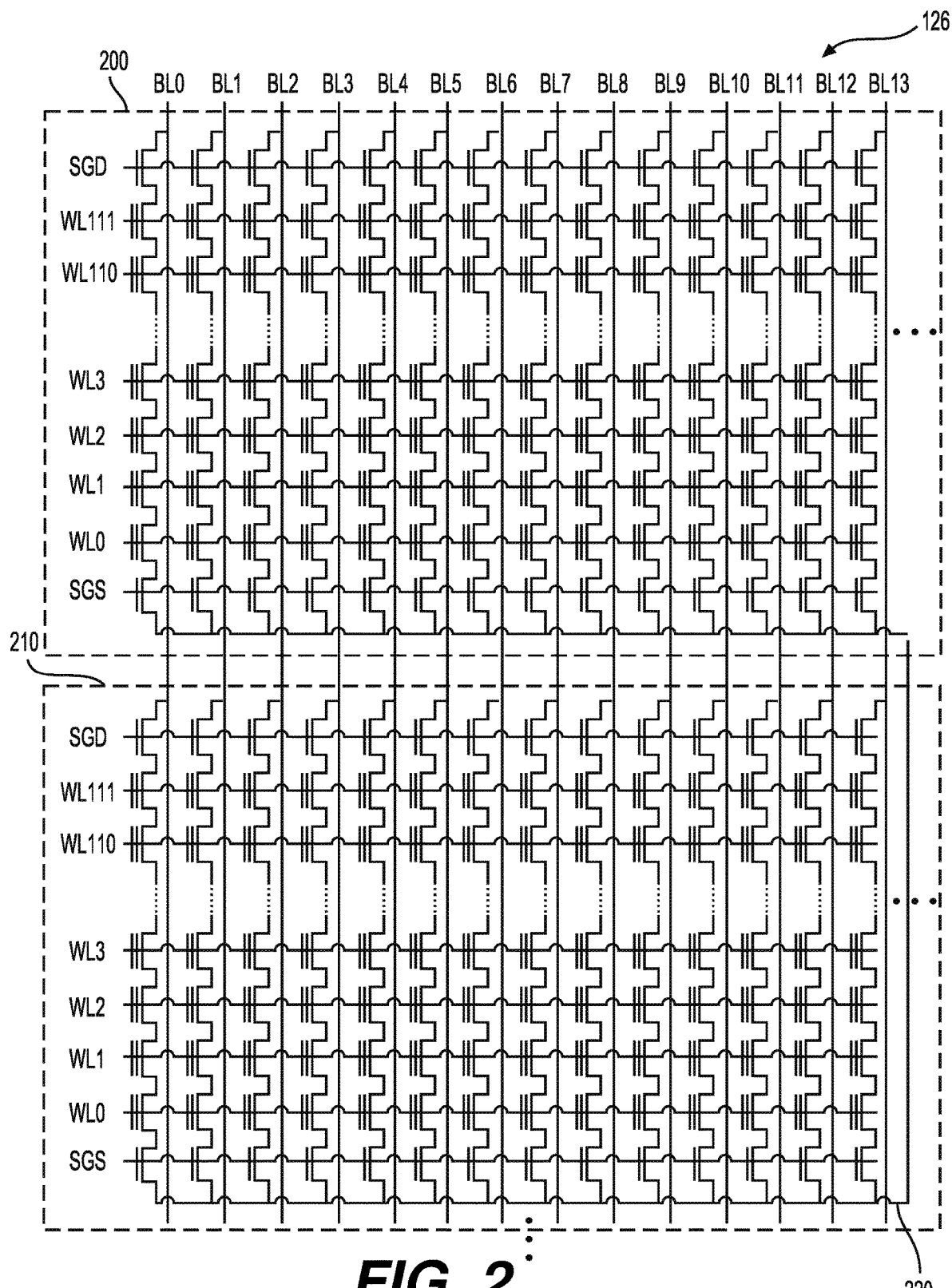
FIG. 2 depicts blocks of memory cells in an example two-dimensional configuration of the memory array of FIG. 1A.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 3A:
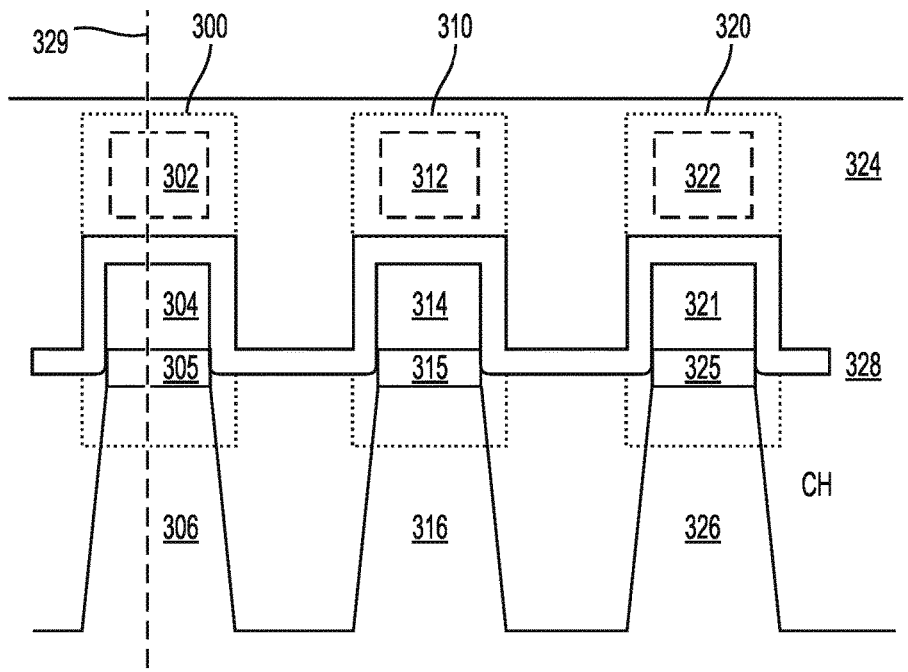
FIG. 3A and FIG. 3B depict cross-sectional views of example floating gate memory cells in NAND strings.
Figure 3B:
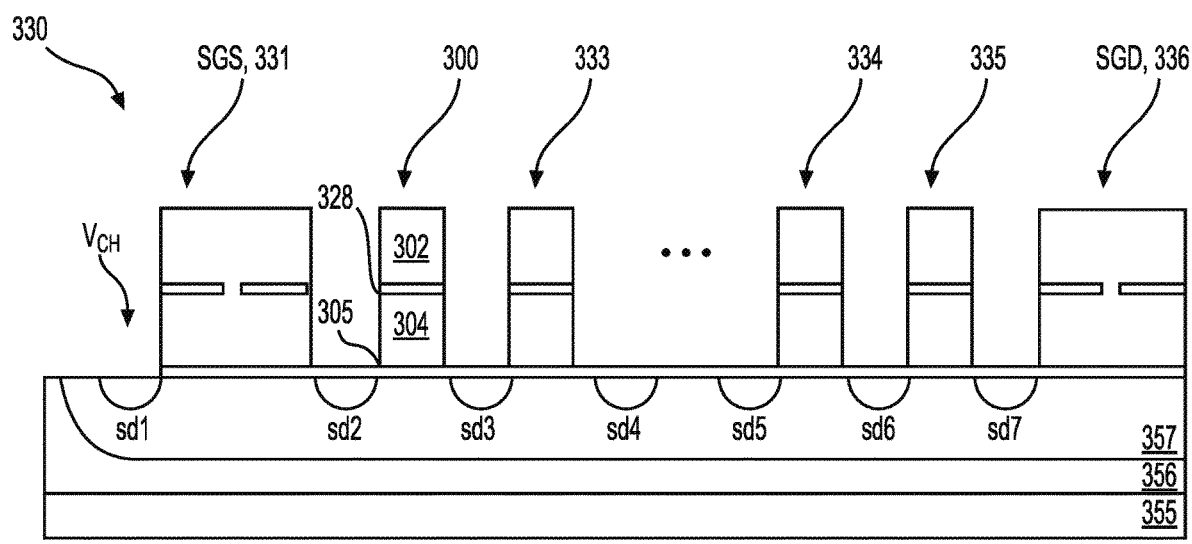

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
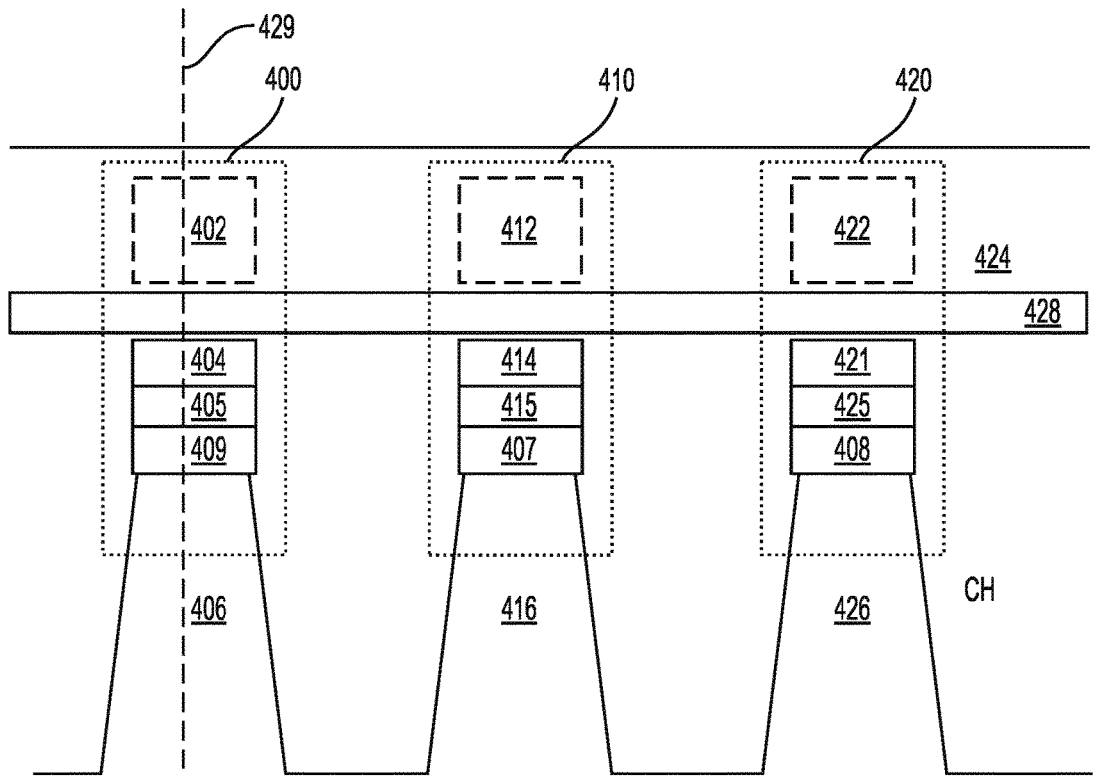
FIG. 4A and FIG. 4B depict cross-sectional views of example charge-trapping memory cells in NAND strings.
Figure 4B:
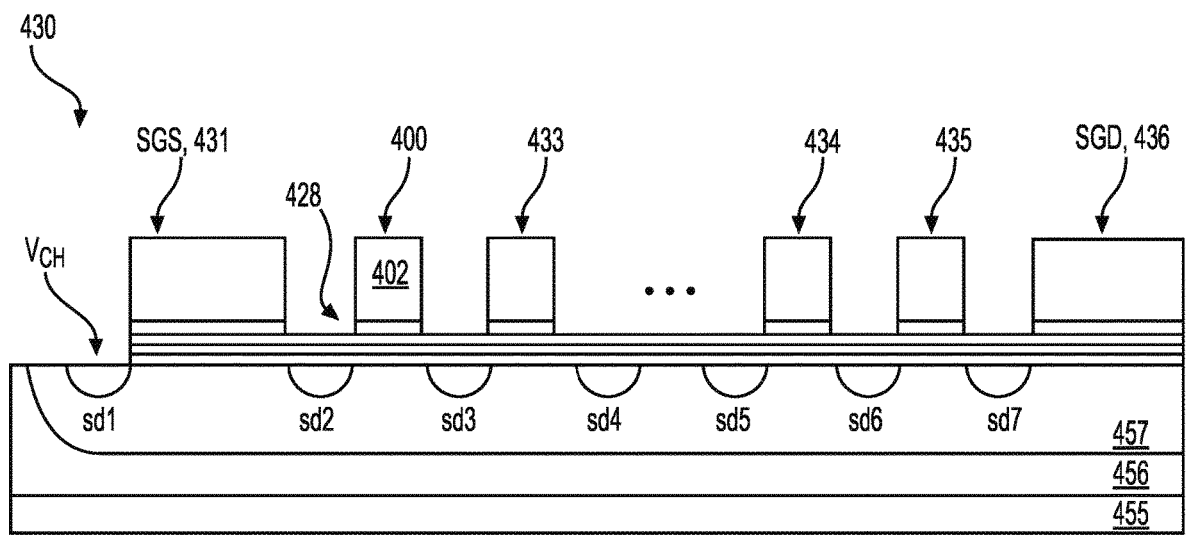

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
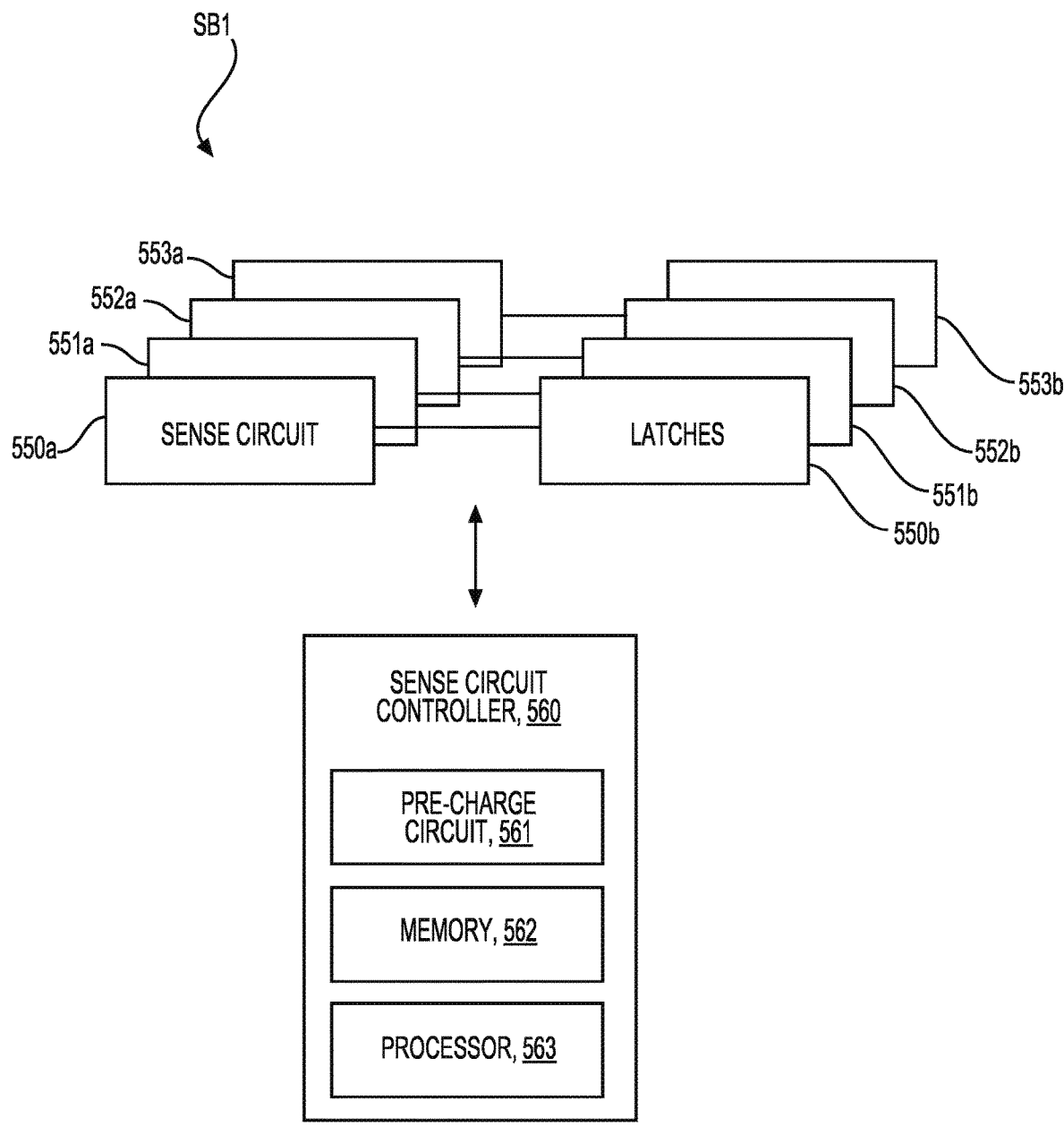
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
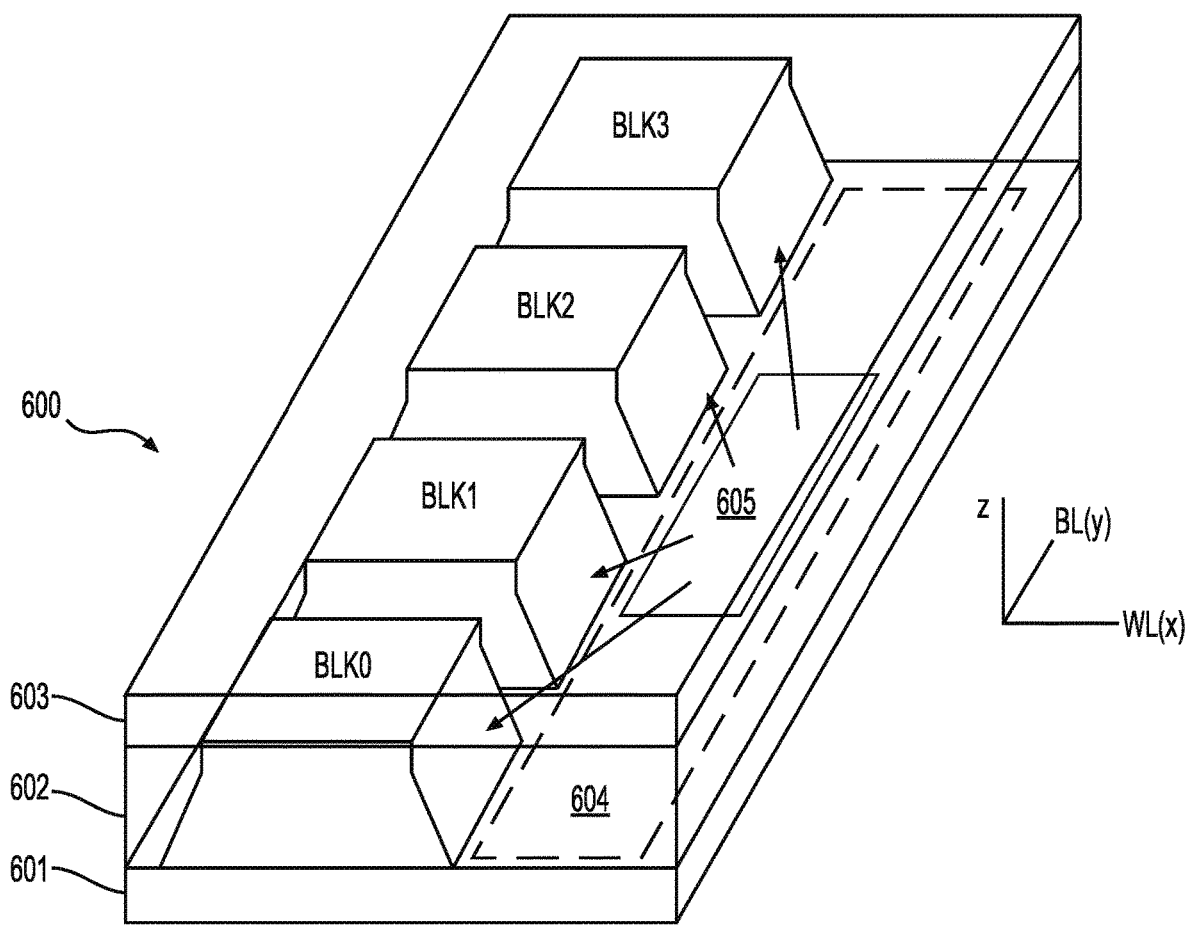
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
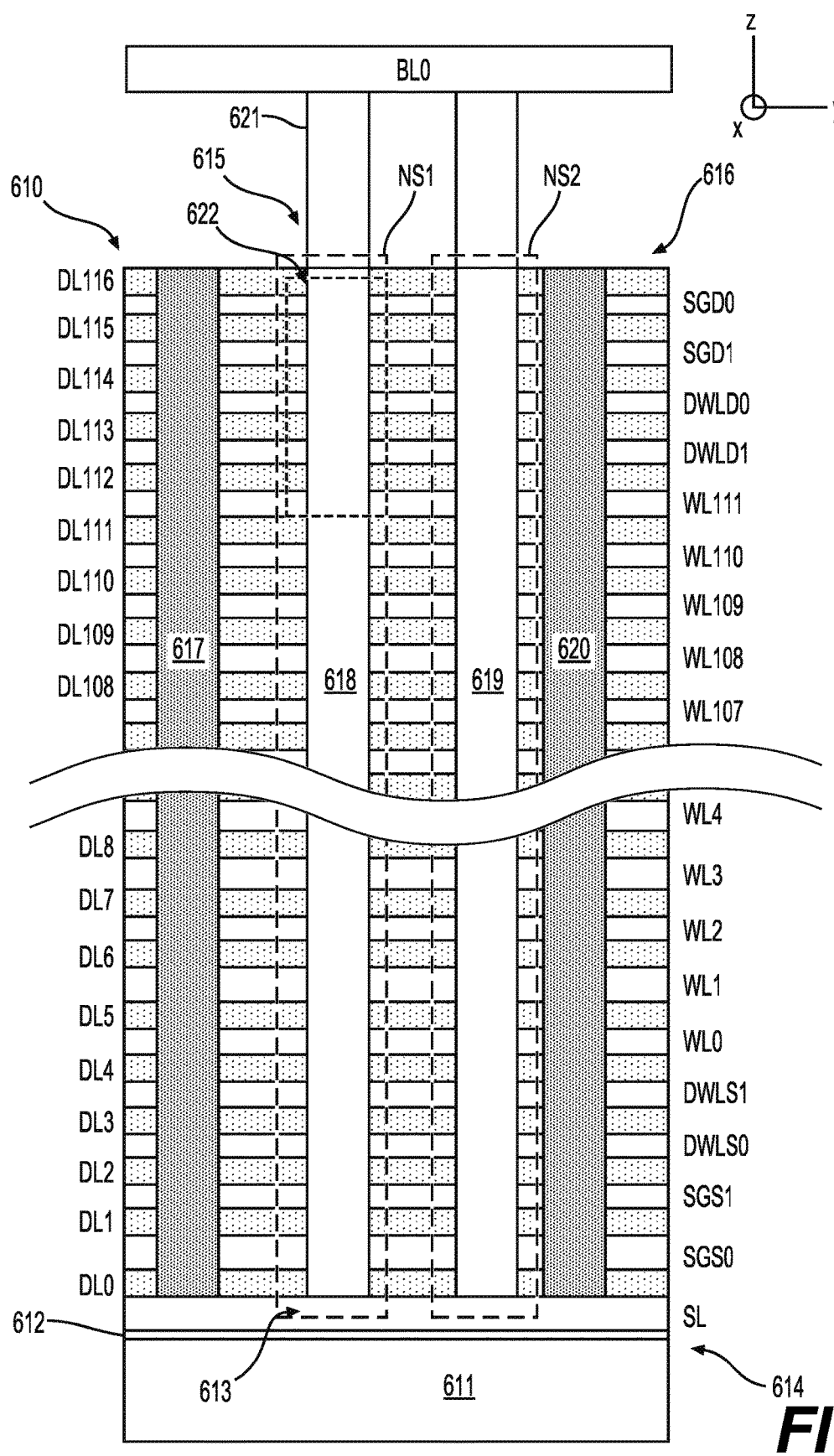
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
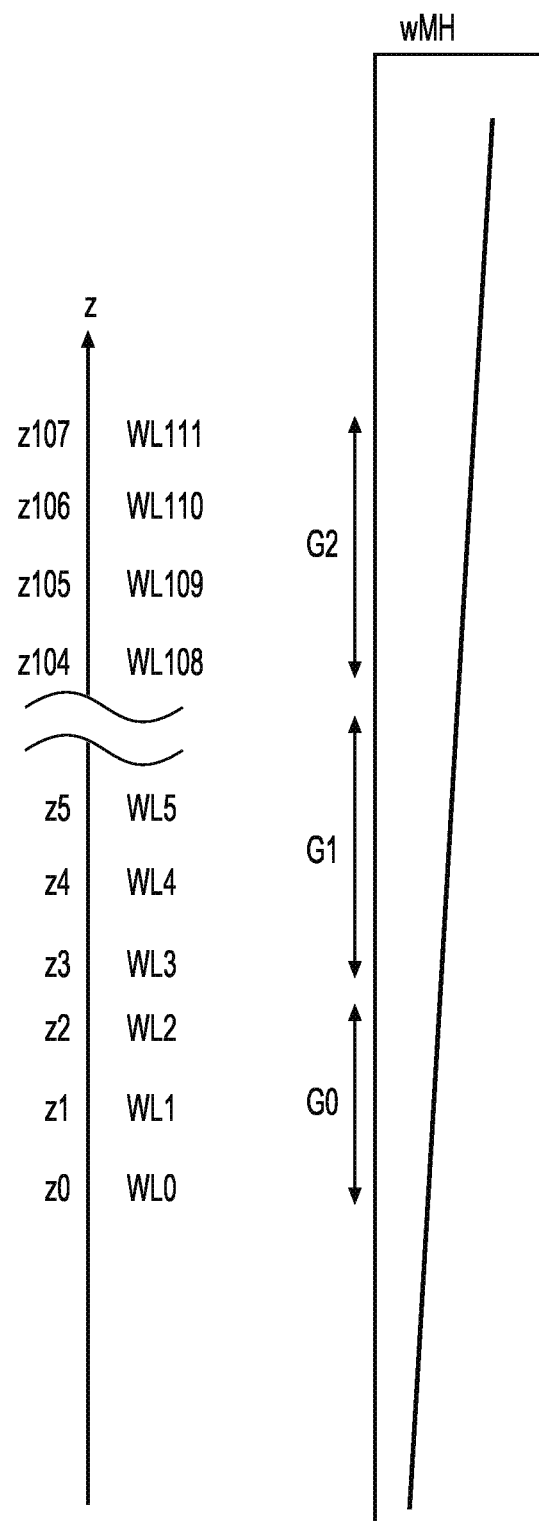
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
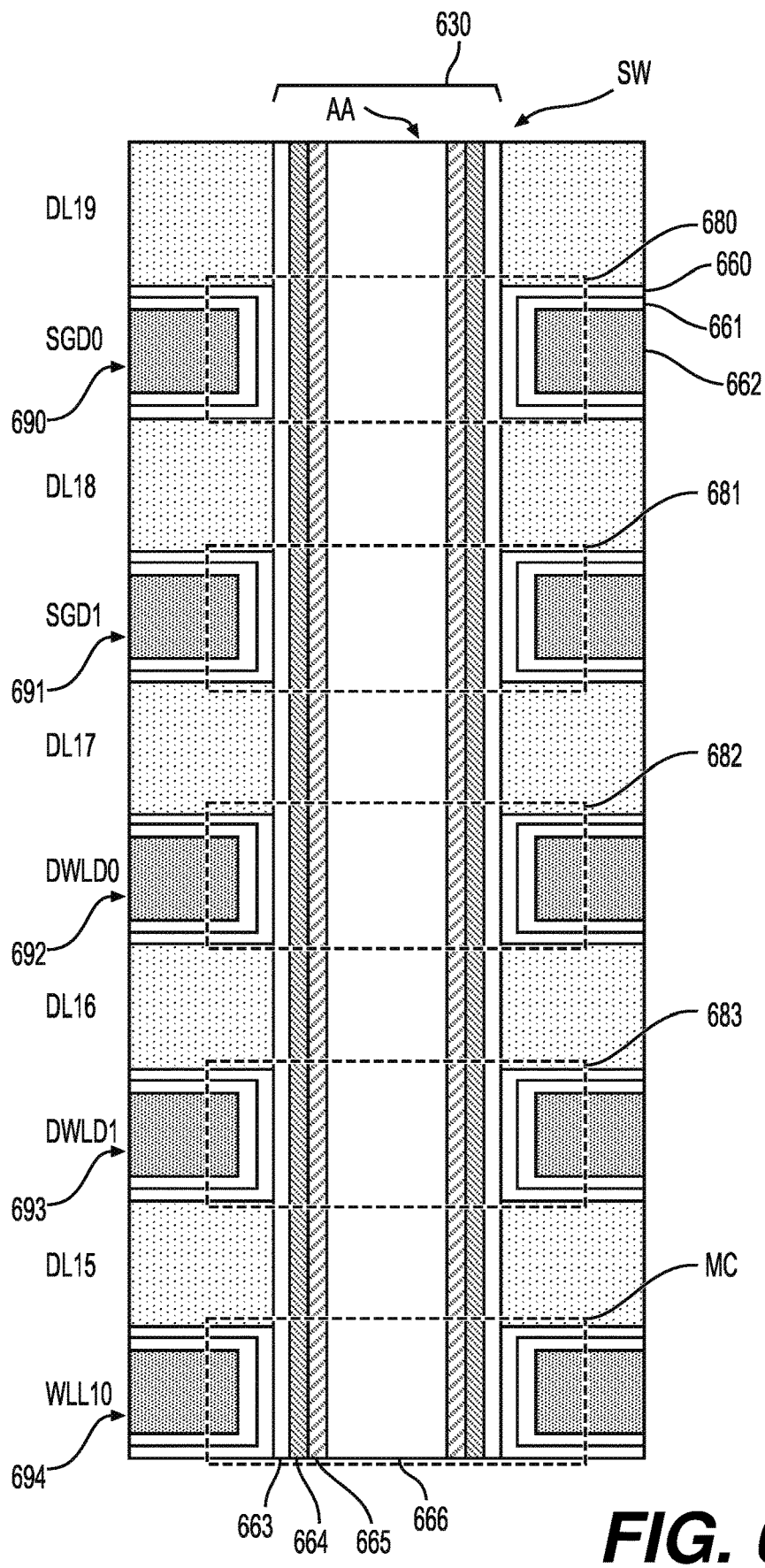
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

Figure 7A:
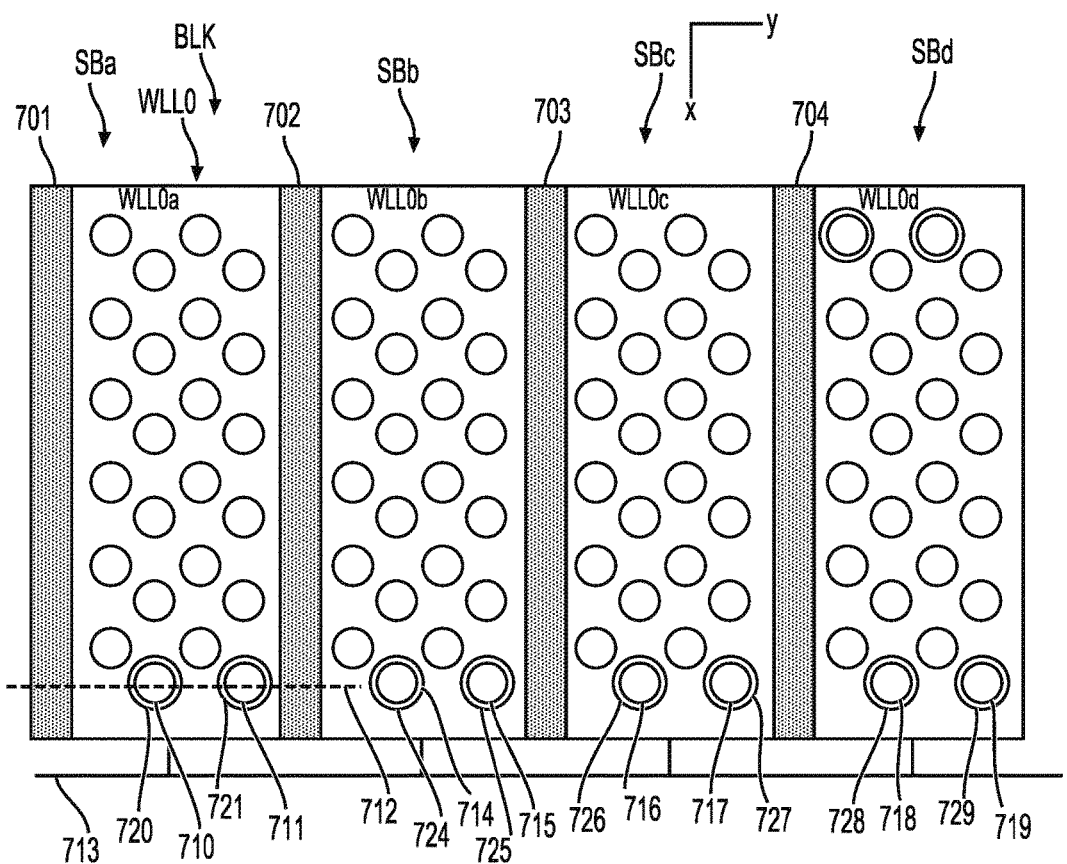
FIG. 7A depicts a top view of an example word line layer WLL0 of the stack of FIG. 6B.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 7B:
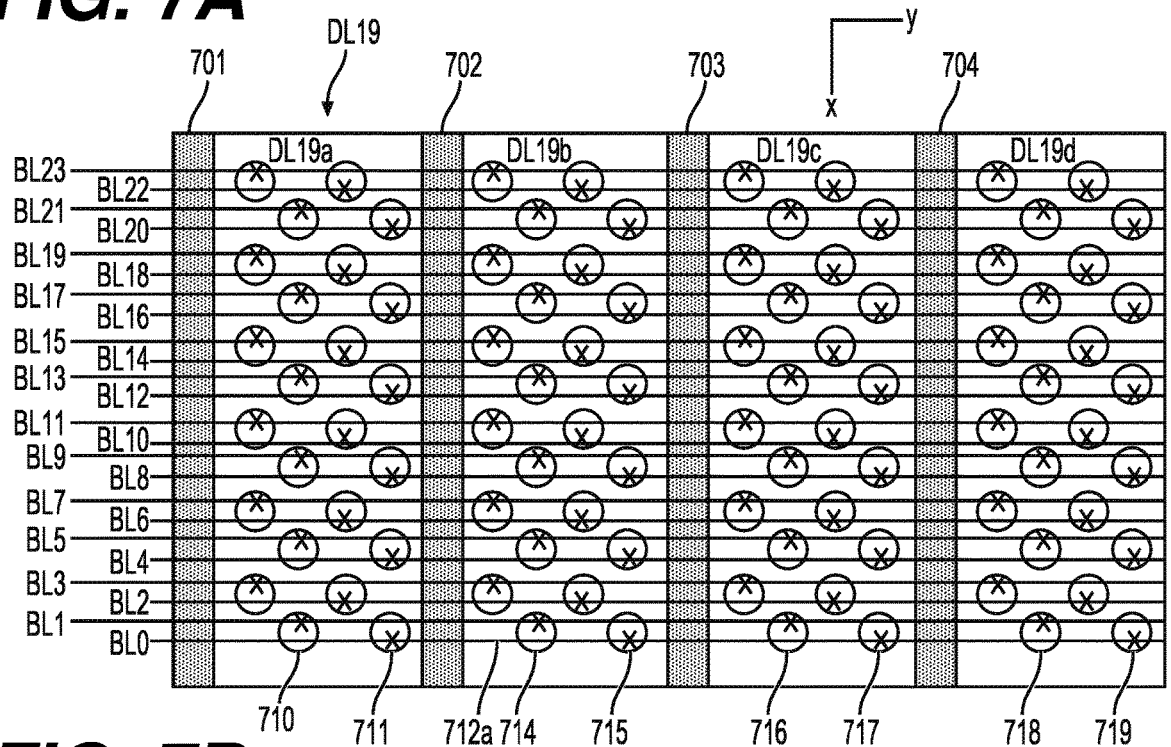
FIG. 7B depicts a top view of an example top dielectric layer DL116 of the stack of FIG. 6B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 713. The last region of a word line layer in a block can be connected to a first region of a word line layer in a next block, in one approach. The contact line 713, in turn, is connected to a voltage driver for the word line layer. The region WL0a has example memory holes 710, 711 along a contact line 712. The region WL0b has example memory holes 714, 715. The region WL0c has example memory holes 716, 717. The region WL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0a, memory cells 724, 725 are in WL0b, memory cells 726, 727 are in WL0c, and memory cells 728, 729 are in WL0d. These memory cells are at a common height in the stack.

Contact line connectors (e.g., slits, such as metal-filled slits) 701, 702, 703, 704 may be located between and adjacent to the edges of the regions WL0a-WL0d. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figure 8:
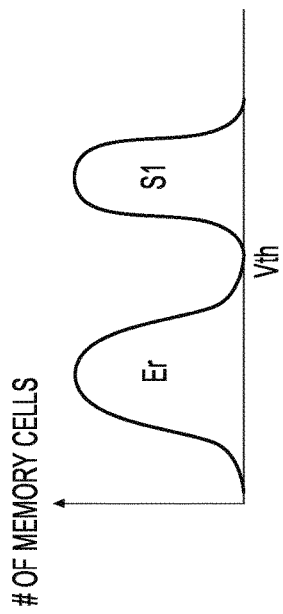
FIG. 8 depicts a threshold voltage distribution of a page of memory cells programmed to one bit per memory cell (SLC)
Figure 9:
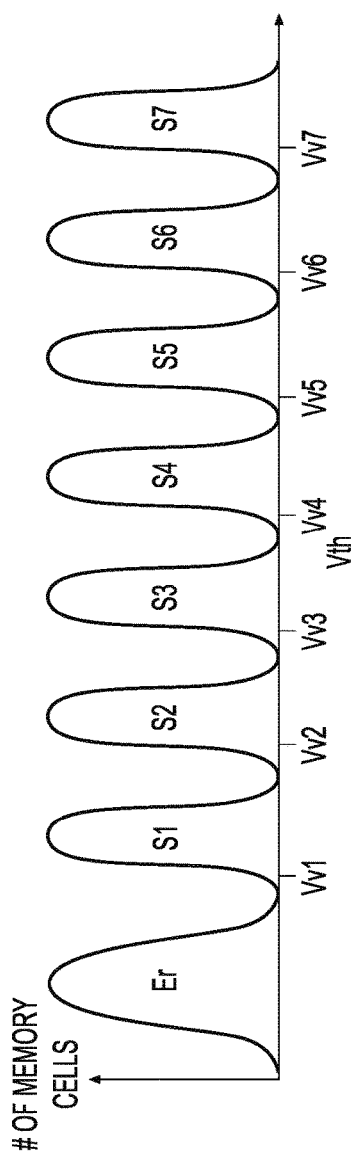
FIG. 9 depicts a threshold voltage distribution of a page of memory cells programmed to three bits per memory cell (TLC)
Figure 10:
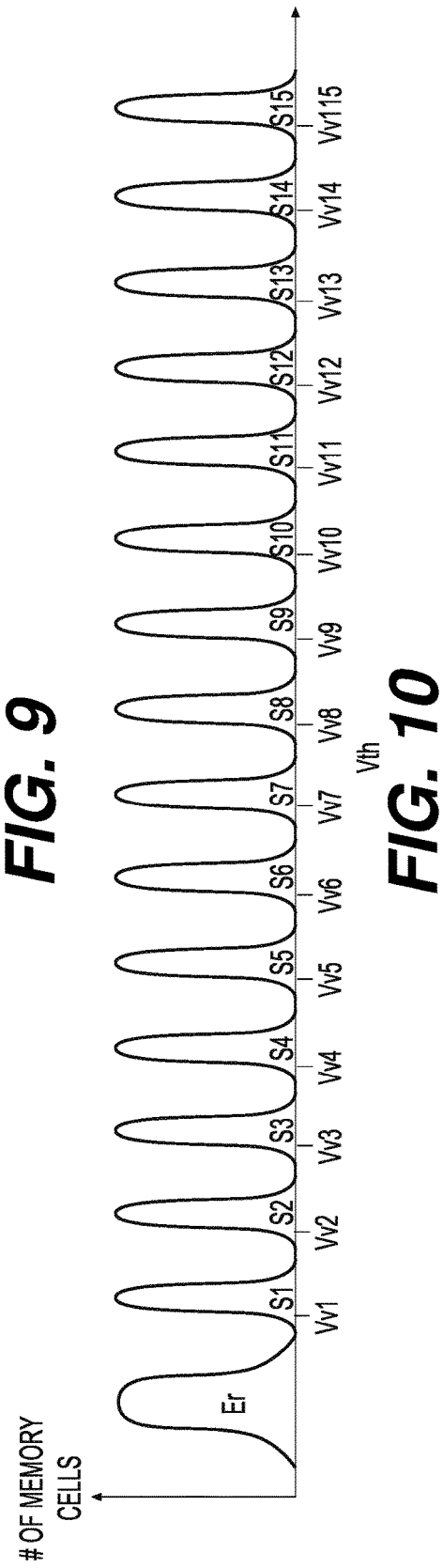
FIG. 10 depicts a threshold voltage distribution of a page of memory cells programmed to four bits per memory cell (QLC)

The memory cells of the memory blocks can be programmed to store one or more bits of data in multiple data states, each of which is associated with a respective threshold voltage Vt. For example, FIG. 8 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 9 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S7) is associated with a verify voltage (Vv1-Vv7), which is employed during a verify portion of a programming operation. FIG. 10 depicts a threshold voltage Vt distribution of a four bits per cell (QLC) storage scheme that includes sixteen total data states, namely the erased state (Er) and fifteen programmed data states (S1-S15). Other storage schemes are also available, such as two bits per cell (MLC) with four data states or five bits per cell (PLC) with thirty-two data states.

In some memory dies, the memory blocks may be configured to operate in multiple storage scheme modes, e.g., an SLC mode and a TLC mode or an SLC mode and a QLC mode. The memory device may then be configured to initially write data to memory blocks operating in an SLC mode, which offers high performance. Then, in a background operation when performance is not important, the memory device can program that data to a multi-bit per memory cell format for long-term storage.

Figure 11:
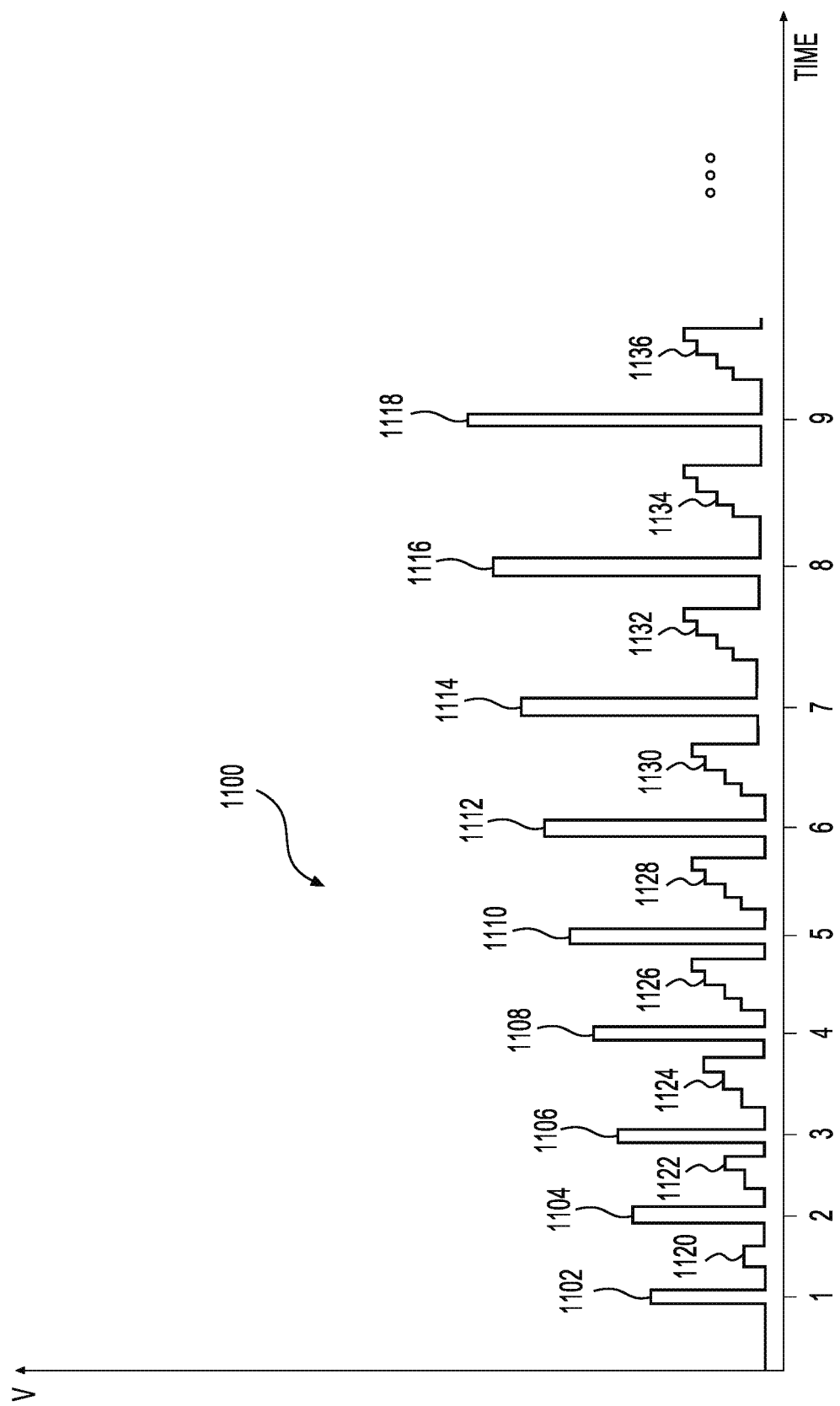
FIG. 11 depicts a voltage waveform of the voltage applied to a control gate of a selected word line during a programming operation.

Programming to multiple bits per memory cell typically includes a plurality of program loops. FIG. 11 depicts a waveform 1100 of the voltages applied to a selected word line during an example memory cell programming operation for programming the memory cells of the selected word line to a greater number of bits per memory cell (e.g., TLC or QLC). As depicted, each program loop includes a programming pulse VPGM and one or more verify pulses, depending on which data states are being programmed in a particular program loop. A square waveform is depicted for each pulse for simplicity; however, other shapes are possible, such as a multilevel shape or a ramped shape.

Incremental Step Pulse Programming (ISPP) is used in this example pulse train, which means that the VPGM pulse amplitude steps up, or increases, in each successive program loop. In other words, the pulse train includes VPGM pulses that increase stepwise in amplitude with each program loop using a fixed step size (dVPGM). A new pulse train starts with an initial VPGM pulse level VPGMU and ends at a final VPGM pulse level, which does not exceed a maximum allowed level. The pulse train 1100 includes a series of VPGM pulses 1101-1115 that are applied to a selected word line that includes a set of non-volatile memory cells. One or more verify voltage pulses 1116-1129 are provided after each VPGM pulse as an example, based on the target data states which are being verified in the program loop. The verify voltages correspond with voltages Vv1-VV7 (shown in FIG. 9). Concurrent with the application of the verify voltages, a sensing operation can determine whether a particular memory cell in the selected word line has a threshold voltage Vt above the verify voltage associated with its intended data state by sensing a current through the memory cell. If the current is relatively high, this indicates that the memory cell is in a conductive state, such that its threshold voltage Vt is less than the verify voltage. If the current is relatively low, this indicates that the memory cell is in a non-conductive state, such that its threshold voltage Vt is above the verify voltage. If the memory cell passes verify, programming of that memory cell is completed and further programming of that memory cell is inhibited for all remaining program loops by applying an inhibit voltage to a bit line coupled with the memory cell. Programming proceeds until all memory cells pass verify for their intended data states, in which case, programming passes, or until a predetermined maximum number of program loops is exceeded, in which case, programming fails. The memory cells of a word line can be divided into a series of string groups, or simply strings, that can be programmed independently of one another, and programming can commence from one string to another across the word line before proceeding to the next word line in the memory block.

Figure 12:
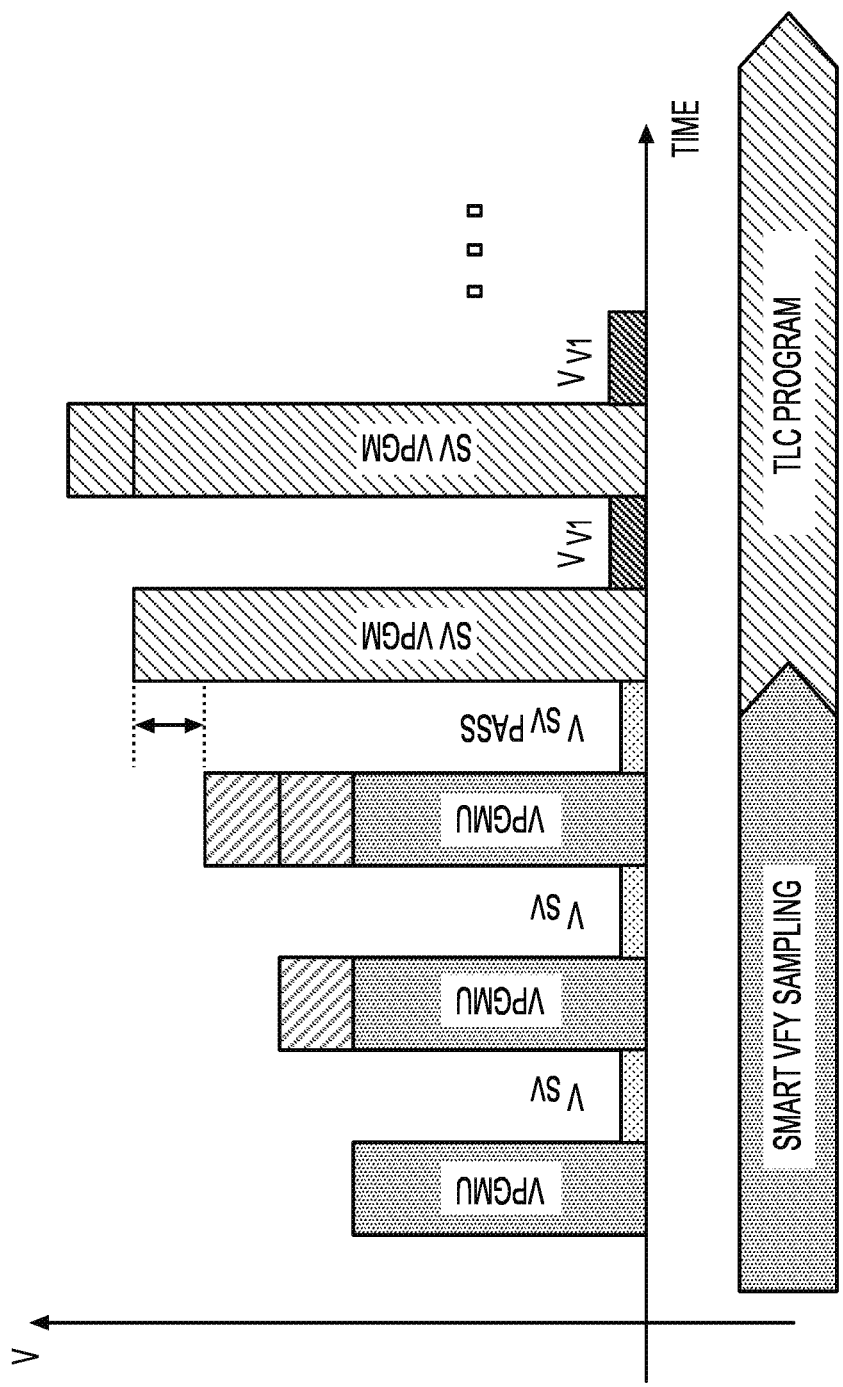
FIG. 12 depicts a voltage waveform of the voltages applied to a control gate of a selected word line during and immediately after a smart verify operation.
Figure 13:
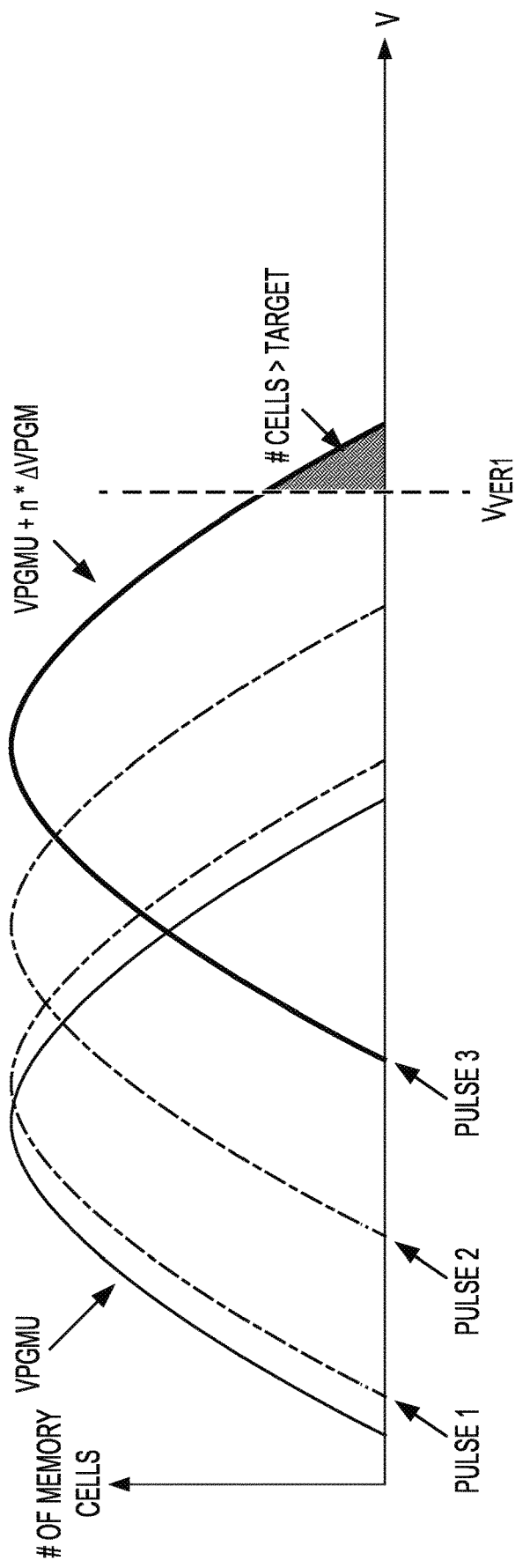
FIG. 13 depicts a threshold voltage distribution of a plurality of memory cells before and following a plurality of program loops of a smart verify operation.

In some programming operations, a "smart verify operation" is performed during the first couple of program loops of a programming operation to acquire an optimal starting programming voltage for the word lines in that memory block. With reference to FIGS. 12 and 13, during the smart verify operation, only a portion of the selected word line (for example, one string) is selected for programming. In a first program loop, a relatively low VPGMU_SV programming pulse is applied to the selected portion of the word line, and then a verify operation is carried out to determine if a number of memory cells that have passed a verify level Vver1 is greater than a target number of memory cells. In the example of FIG. 13, after the first program loop, no memory cells have threshold voltages that are greater than the verify level Vver1. If the number of memory cells that pass the verify operation is not greater than the target, then the programming voltage is stepped up (VPGM=VPGM+dVPGM) and another program loop begins. This continues for as many program loops as it takes for the target number of memory cells that pass verify to exceed the verify level Vver1. In the example of FIGS. 12 and 13, this takes three program loops. Once the verify operation passes, VPGM or VPGM plus one more increment dVPGM is set to SV_VPGM, and is stored in the NAND register of the chip. If other strings and word lines in the same memory block are subsequently programmed, then the initial programming voltage VPGMU in the first program loop of those subsequent programming operations is set to SV_VPGM, thereby improving performance by skipping unnecessary program loops without overprogramming the memory cells.

In the example of FIGS. 12 and 13, the smart verify operation passes on the third smart verify program loop (the shaded area of the curve in FIG. 13 identifies the memory cells that have passed verify). Thus, SV_VPGM for subsequent word lines and strings is set to VPGMU_SV plus three times dVPGM, i.e., SV_VPGM=VPGMU_SV+3*dVPGM. In other memory blocks within the same chip or in different chips, the number of program loops to pass smart verify could be less than, equal to, or more than three, i.e., the optimal SV_VPGM is unique to each memory block and may even be unique to each word line within the same memory block.

In many chips, the NAND register, which stores SV_VPGM, contains only one byte of data per chip, which is enough data to store only one SV_VPGM at a time. In other chips, the NAND register may contain more than one byte (for example, no more than three bytes), but the number of bytes in the NAND register is far fewer than there are memory blocks in the chip. In the byte of data, different bit combinations can be associated with different SV_VPGM voltages, such as those found in FIG. 14. Since the optimum initial programming voltage VPGM varies from memory block to memory block across a chip and the register of the chip contains just one byte of data or far fewer bytes of data than there are memory blocks (for example, no more than three bytes), this necessitates re-acquiring SV_VPGM each time programming switches from one block to another block, i.e., block jumping. In other words, every time programming jumps from one memory block to another memory block, even if the next block has already been partially programmed and SV_VPGM was previously acquired, that memory block's unique SV_VPGM voltage has been lost and replaced in the NAND register and the smart verify operation must be performed so SV_VPGM can be re-acquired and written back into the NAND register. This re-acquisition process takes time and resources of the memory chip, thereby reducing performance.

One aspect of the present disclosure is related to a programming technique wherein once SV_VPGM is acquired for a memory block, instead of only being written to the register, SV_VPGM is also directly written into a spare byte of that memory block. From there, SV_VPGM can be retained long term and returned to the NAND register without having to conduct the smart verify operation again. Thus, in the case of block jumping, SV_VPGM for the block being programmed can be read from that spare byte and saved to the NAND register for use when programming the word lines in the memory block without the time-consuming re-acquisition operation. This improves performance of the memory device by reducing programming time. In some embodiments, SV_VPGM can be saved for an entire memory block in a chip such that the smart verify operation only has to take place once for each memory block and only has to be repeated in the memory block of that memory block is subsequently erased. As also discussed in further detail below, in some embodiments, SV_VPGM can be acquired and stored on a word line-by-word line basis, further improving programming performance and reliability. In other words, rather than a single SV_VPGM being used when programming all word lines in a memory block, each word line (or a certain number of word lines) may be provided with its own unique and optimized SV_VPGM that is saved for long term storage within the word line itself.

Figure 15:
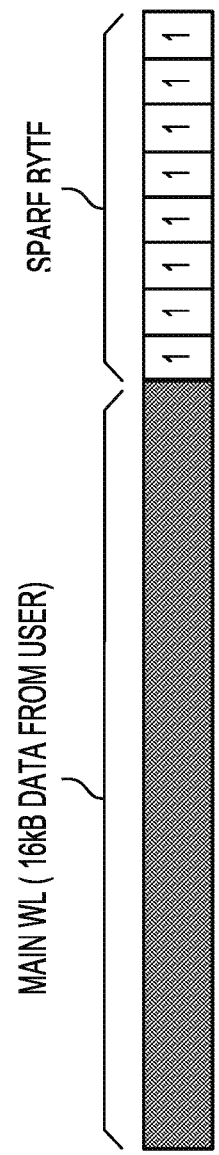
FIG. 15 is a schematic view of an example word line identifying the portion of the word line that is dedicated to user data and the portion of the word line that is dedicated to the smart verify byte.

In a memory block, when programmed, each word line contains a large amount of data. In the example embodiment of FIG. 15, the word line depicted contains sixteen kilobytes (16 kB) of total data. The vast majority of this capacity is reserved for user data, but one or more spare bytes can be used for various purposes, e.g., error correction code (ECC) or column redundancy that can be used to repair defective columns. According to the programming techniques of the present disclosure, one of these spare bytes (hereinafter referred to as a "smart verify byte") of each word line is dedicated to storing SV_VPGM. A table, such as the one depicted in FIG. 14, can be stored in the chip and associates different bit combinations in this smart verify byte with different SV_VPGM voltages. In some embodiments, SV_VPGM can be stored in one word line of the memory block and then used for all subsequent word lines in that memory block. In other embodiments, SV_VPGM is saved into the spare byte of each word line.

Figure 16:
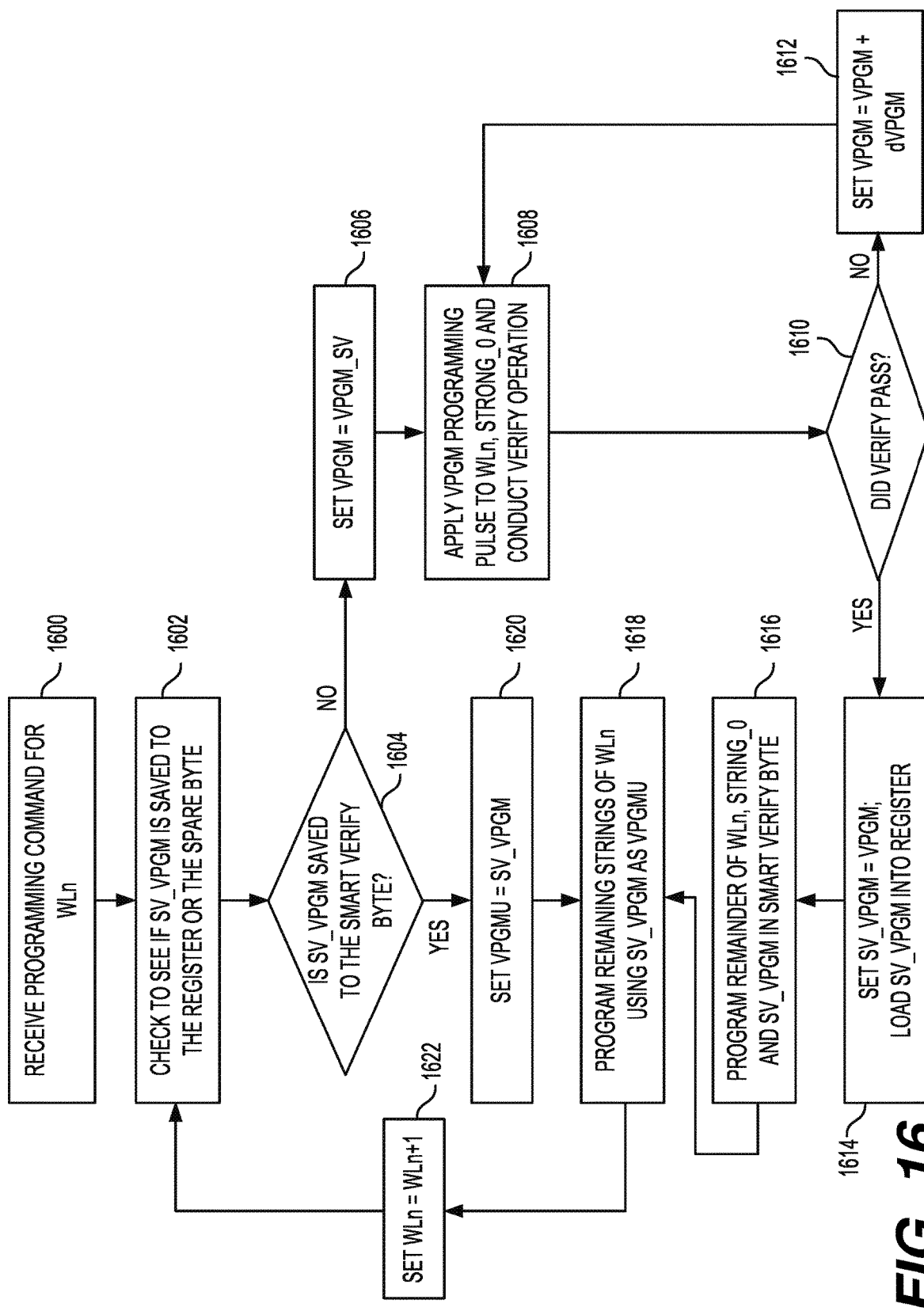
FIG. 16 is a flow chart depicting the steps of programming the word lines in a memory block according to an example embodiment of the present disclosure.

Turning now to FIG. 16, the steps of programming the word lines of an example memory block are depicted. At step 1600, a data write command is received. In some embodiments, this may be a data write command that necessitates a block jump. At step 1602, control circuitry in the chip checks the memory block to determine if SV_VPGM for the target word line is saved to the NAND register and, if not, if SV_VPGM has been written to the smart verify byte. In an example embodiment where each word line has a unique SV_VPGM, if the string of a word line WLn being programmed is anything other than String_0 (a first string of the word line), then SV_VPGM should already be programmed to the smart verify byte of WLn, String_0. In other embodiments, SV_VPGM may be common to a group of word lines or to the entire memory block. In that case, the smart verify byte may be located elsewhere, such as in the smart verify byte of another word line. For example, in some embodiments, SV_VPGM can be acquired for every other word line and used for two, three, or more word lines. If the SV_VPGM voltage is saved in the smart verify byte but not in the NAND register, then at this stage, SV_VPGM is written into the NAND register.

At decision step 1604, it is determined if SV_VPGM is programmed to the smart verify byte in the memory block.

Figure 17:
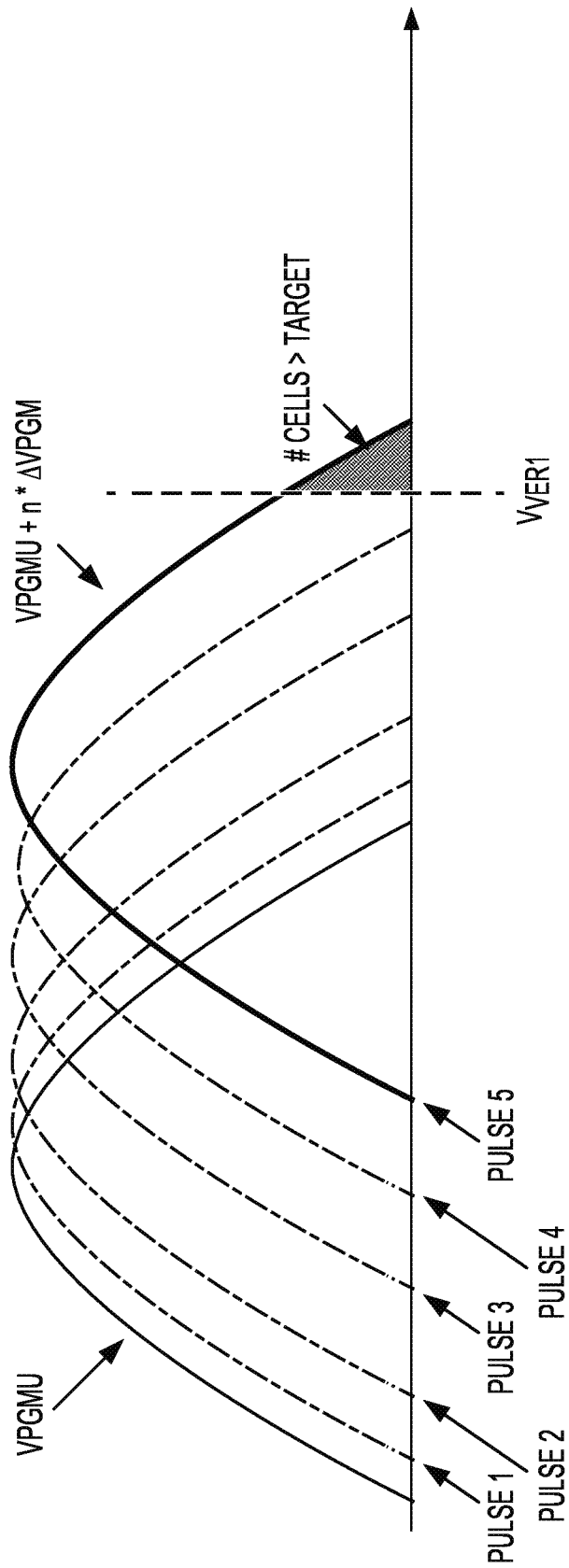
FIG. 17 depicts a threshold voltage distribution of a plurality of memory cells before and following a plurality of program loops of a smart verify operation.

If the answer at decision step 1604 is "no," then at step 1606, the programming voltage VPGM is set to an initial smart verify programming voltage VPGMU_SV, which is at a relatively low voltage level. At step 1608, a first smart verify program loop is commenced with a programming pulse VPGM being applied to the target word line followed by a verify operation. The verify operation includes counting a number of memory cells that have threshold voltages which exceed a smart verify voltage Vver1 (see FIG. 17) and comparing that number to a target.

At decision step 1610, it is determined if the verify operation passed, i.e., did the number of memory cells with threshold voltages above the verify voltage exceed the target? If the answer at decision step 1610 is "no," then at step 1612, VPGM is incrementally increased, i.e., VPGM=VPGM+dVPGM. The method then returns to step 1608 to begin another smart verify program loop. The method proceeds through the loop of steps 1608-1612 for "N" program loops until the verify operation passes. In the example depicted in FIG. 17, the verify operation fails in the first four smart verify program loops and passes on the fifth smart verify program loop. However, the number of smart verify program loops to pass the verify operation will vary from block to block and, sometimes, from word line to word line. If the answer at decision step 1610 is "yes," then at step 1614, VPGM is set to SV_VPGM and loaded into the NAND register.

At step 1616, the user data is programmed into the memory cells of the target word line in one or more programming loops using an ISPP programming technique. The memory cells of the target word line may be programmed to any suitable programming scheme, e.g., MLC, TLC, or QLC. During step 1616, at program loop N+m, the smart verify byte of the target word line is programmed to contain data associated with the SV_VPGM voltage.

In an example embodiment, even if the memory cells containing user data are programmed to a higher number of bits per memory cell and with a verify operation in each program loop, the memory cells of the smart verify byte can be programmed to SLC in a single program loop (loop N+m) without verify. For example, if when erased, the smart verify byte reads "1, 1, 1, 1, 1, 1, 1, 1" and the data associated with the SV_VPGM voltage is "0, 1, 0, 1, 1, 1, 0, 1" then during the programming pulse of program loop N+m, the bit lines coupled to the second, fourth, fifth, sixth, and eighth memory cells receive an inhibit voltage so that programming only commences in the first, third, and seventh memory cells. For the remaining program loops of the programming operation, all of these memory cells are inhibited from programming such that the additional time required to program the smart verify byte is negligible. The specific program loop that the programming of the smart verify byte occurs on may be selected based on which program loop the VPGM voltage is at an optimum level for a one programming pulse, zero verify (1P0V) programming operation. In an example embodiment, the N+m pulse where memory cells of the smart verify byte are programmed may be the pulse following the completion of programming to the S1 data state. Thus, programming of the smart verify byte does not increase the time required to program the rest of the word line but is instead hidden within the programming operation that is already taking place. In this example, the threshold voltage Vt distribution of the memory cells in the smart verify byte may approximate FIG. 8 (SLC) and the threshold voltage Vt distributions of the remaining memory cells in the word line may approximate either FIG. 9 (TLC) or FIG. 10 (QLC). Because the memory cells of the smart verify byte are non-volatile, SV_VPGM remains accessible and does not have to be re-acquired even if the memory device is powered off and powered back on.

If the answer at decision step 1604 is "yes," then at step 1620, the smart verify byte is read and SV_VPGM is loaded into the register without conducting the smart verify operation.

Following either step 1616 or 1620, at step 1618, the remaining strings of the selected WLn are programmed using an ISPP programming technique and with an initial programming voltage VPGMU that is equal to SV_VPGM. At step 1622, the word line being programmed is incrementally advanced, i.e., WLn=WLn+1. This process continues until the write command is completed or the memory block is full, i.e., closed.

FIG. 18 is a table depicting a programming order or sequence of the above-discussed programming techniques as applied to an example memory block with word lines that are divided into four strings (labeled String_0 through String_3) according to one embodiment of the present disclosure. The first operation is to perform the smart verify operation on the memory cells of String_0 of the first word line to be programmed (WLn) to acquire the smart verify voltage for the word line WLn, i.e., SV_VPGM WLn. Next, the memory cells of WLn, String_0 are programmed to contain the user data and data containing the SV_VPGM WLn voltage. The second, third, and fourth programming operations are programming the memory cells of String_1, String_2, and String_3 respectively of word line WLn using SV_VPGM WLn as the initial programming voltage VPGMU for these programming operations.

Programming then moves to the next sequential word line in the memory block, i.e., WLn+1. The fifth programming operation is to acquire SV_VPGM WLn+1 and program String_0, WLn+1. The sixth, seventh, and eighth programming operations are to program String_1, String_2, and String_3 respectively of word line WLn+1 using SV_VPGM WLn+1 as the initial programming voltage VPGMU of these programming operations. This pattern continues for word lines WLn+2 onward until the write operation is completed.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of programming a memory device, comprising the steps of:
   receiving a command to write user data to the memory device;
   preparing at least one memory block that includes a plurality of memory cells arranged in a plurality of word lines;
   on at least a portion of a selected word line of the plurality of word lines, performing a smart verify operation to acquire a smart verify programming voltage; and
   after the smart verify programming voltage is acquired, in a plurality of program loops, programming the memory cells of the selected word line to include the user data and data that corresponds to the smart verify programming voltage.

2. The method as set forth in claim 1, wherein the selected word line includes a plurality of strings and wherein the step of performing the smart verify operation to acquire the smart verify programming voltage is only on a first string of the plurality of strings and wherein the step of programming the memory cells of the selected word line includes programming the data that corresponds to the smart verify programming voltage into the memory cells of the first string of the selected word line.

3. The method as set forth in claim 2, further including the step of programming the user data into the memory cells of the other strings of the selected word line in a plurality of program loops using the smart verify programming voltage as an initial programming voltage.

4. The method as set forth in claim 2, wherein each of the word lines of the memory block includes the plurality of strings, and further including the steps of performing the smart verify operation on the first string of each of the word lines to acquire the smart verify programming voltage for each word line and programming in data that corresponds to the smart verify programming voltage for each word line into the memory cells of the first string of that word line.

5. The method as set forth in claim 2, wherein the smart verify programming voltage programmed into the memory cells of the first string of the selected word line is the initial programming voltage when programming at least one additional word line in a plurality of program loops.

6. The method as set forth in claim 2, wherein the memory cells of the first string that are programmed to contain the data that corresponds to the smart verify programming voltage are programmed to a one bit per memory cell (SLC) storage scheme.

7. The method as set forth in claim 6, wherein the memory cells of the first string that are programmed to contain the user data are programmed to a one or more bits per memory cell storage scheme.

8. The method as set forth in claim 2, wherein the data that corresponds to the smart verify programming voltage and that is programmed to the memory cells of the first string is no more than one byte of data.

9. The method as set forth in claim 1, wherein the memory device has a NAND register that can contain only no more than three bytes of data.

10. A memory device, comprising:
    at least one memory block that includes a plurality of memory cells arranged in a plurality of word lines;
    control circuitry configured to program the memory cells of the at least one memory block in a plurality of program loops, the control circuitry being configured to;
        receive a command to write user data to the memory device,
        on at least a portion of a selected word line of the plurality of word lines, perform a smart verify operation to acquire a smart verify programming voltage, and
        after the smart verify programming voltage is acquired, in a plurality of program loops, program the memory cells of the selected word line to include the user data and data that corresponds to the smart verify programming voltage.

11. The memory device as set forth in claim 10, wherein the selected word line includes a plurality of strings, and the control circuitry is configured to program the data that corresponds to the smart verify programming voltage into the memory cells of the first string of the selected word line.

12. The memory device as set forth in claim 11, wherein the control circuitry is further configured to program the user data into the memory cells of the other strings of the selected word line in a plurality of program loops using the smart verify programming voltage as an initial programming voltage.

13. The memory device as set forth in claim 11, wherein each of the word lines of the memory block includes the plurality of strings, and wherein the control circuitry is further configured to perform the smart verify operation on the first string of each of the word lines to acquire the smart verify programming voltage for each word line and program data that corresponds to the smart verify programming voltage for each word line into the memory cells of the first string of that word line.

14. The memory device as set forth in claim 11, wherein the smart verify programming voltage programmed into the memory cells of the first string of the selected word line by the control circuitry is the initial programming voltage when programming at least one additional word line of the memory block in a plurality of program loops.

15. The memory device as set forth in claim 11, wherein the memory cells of the first string that are programmed by the control circuitry to contain the data that corresponds to the smart verify programming voltage are programmed to a one bit per memory cell (SLC) storage scheme.

16. The memory device as set forth in claim 15, wherein the memory cells of the first string that are programmed by the control circuitry to contain the user data are programmed to a two or more bits per memory cell storage scheme.

17. The memory device as set forth in claim 11, wherein the data that corresponds to the smart verify programming voltage and that is programmed to the memory cells of the first string is no more than one byte of data.

18. The memory device as set forth in claim 10, further including a NAND register that can contain no more than three bytes of data.

19. An apparatus, comprising:
at least one memory block that includes a plurality of memory cells arranged in a plurality of word lines;
a programming means for programming user data into the plurality of memory cells and configured to program the memory cells of the at least one memory block in a plurality of program loops, the programming means being configured to;
receive a command to write user data to the memory device,
on a first string of a plurality of strings of a selected word line of the plurality of word lines, perform a smart verify operation to acquire a smart verify programming voltage,
after the smart verify programming voltage is acquired, in a plurality of program loops, program the memory cells of the selected word line to include the user data and data that corresponds to the smart verify programming voltage, and
program the memory cells of the other strings of the selected word line in a plurality of program loops using the smart verify programming voltage as an initial programming voltage.

20. The apparatus as set forth in claim 19, wherein the programming means is further configured to perform the smart verify operation on the first string of each word line of the plurality of word lines in the memory block and program data corresponding to a unique smart verify programming voltage into the memory cells of the first string of each word line.

* * * * *